(12) United States Patent
Kawano

(10) Patent No.: US 10,641,788 B2
(45) Date of Patent: May 5, 2020

(54) ELECTRONIC DEVICE, ELECTRONIC DEVICE APPARATUS, ELECTRONIC APPARATUS, AND MOVING OBJECT

(71) Applicant: Seiko Epson Corporation, Tokyo (JP)

(72) Inventor: Shuichi Kawano, Suwa (JP)

(73) Assignee: Seiko Epson Corporation (JP)

( * ) Notice: Subject to any disclaimer, the term of this patent is extended or adjusted under 35 U.S.C. 154(b) by 196 days.

(21) Appl. No.: 15/711,144

(22) Filed: Sep. 21, 2017

(65) Prior Publication Data

US 2018/0095105 A1 Apr. 5, 2018

(30) Foreign Application Priority Data

Sep. 30, 2016 (JP) ................. 2016-193937

(51) Int. Cl.
| | | |
|---|---|---|
| *H01L 27/20* | (2006.01) | |
| *G01P 15/08* | (2006.01) | |
| *G01C 19/5783* | (2012.01) | |
| *G01P 3/44* | (2006.01) | |
| *G01P 15/125* | (2006.01) | |
| *H05K 1/11* | (2006.01) | |
| *H01L 29/84* | (2006.01) | |

(52) U.S. Cl.
CPC ...... *G01P 15/0802* (2013.01); *G01C 19/5783* (2013.01); *G01P 3/44* (2013.01); *G01P 15/08* (2013.01); *G01P 15/125* (2013.01); *H05K 1/118* (2013.01); *G01P 2015/0814* (2013.01); *H01L 29/84* (2013.01); *H01L 2224/48091* (2013.01); *H01L 2224/48463* (2013.01); *H01L 2224/49109* (2013.01); *H01L 2224/73265* (2013.01); *H01L 2924/181* (2013.01)

(58) Field of Classification Search
None
See application file for complete search history.

(56) References Cited

U.S. PATENT DOCUMENTS

| | | |
|---|---|---|
| 6,103,400 A | 8/2000 | Yamada et al. |
| 2012/0111615 A1 | 5/2012 | Yoda et al. |
| 2012/0267150 A1 | 10/2012 | Yoda et al. |
| 2016/0003650 A1* | 1/2016 | Kanamaru ......... G01C 19/5783 73/431 |
| 2016/0050744 A1* | 2/2016 | Lee ...................... H05K 1/0206 361/712 |

FOREIGN PATENT DOCUMENTS

| | | |
|---|---|---|
| JP | H06-347475 A | 12/1994 |
| JP | H11-205898 A | 7/1999 |
| JP | H11-284466 A | 10/1999 |
| JP | H11-297733 A | 10/1999 |
| JP | 2002-057540 A | 2/2002 |

(Continued)

*Primary Examiner* — Ali Naraghi
(74) *Attorney, Agent, or Firm* — Harness, Dickey & Pierce, P.L.C.

(57) ABSTRACT

An electronic device includes a base body, a functional element disposed on the base body, a wiring disposed on the base body and electrically connected to the functional element, and a terminal disposed on the base body and electrically connected to the wiring, wherein the terminal includes a non-overlapping region which does not overlap with the wiring. Further, the terminal includes an overlapping region which overlaps with the wiring.

18 Claims, 15 Drawing Sheets

(56) References Cited

FOREIGN PATENT DOCUMENTS

| | | |
|---|---|---|
| JP | 2006-101244 A | 4/2006 |
| JP | 2006-191466 A | 7/2006 |
| JP | 2006-222522 A | 8/2006 |
| JP | 2010-219992 A | 9/2010 |
| JP | 2014-016259 A | 1/2014 |
| JP | 2014-170006 A | 9/2014 |
| JP | 2015-007656 A | 1/2015 |
| JP | 2015-046667 A | 3/2015 |
| JP | 2015-062040 A | 4/2015 |
| JP | 2015-165240 A | 9/2015 |
| JP | 2015-206801 A | 11/2015 |
| JP | 2016-183971 A | 10/2016 |

* cited by examiner

ELECTRONIC DEVICE, ELECTRONIC DEVICE APPARATUS, ELECTRONIC APPARATUS, AND MOVING OBJECT

BACKGROUND

1. Technical Field

The present invention relates to an electronic device, an electronic device apparatus, an electronic apparatus, and a moving object.

2. Related Art

For example, as an acceleration sensor, the configuration disclosed in JP-A-06-347475 (Patent Document 1) is known. The acceleration sensor disclosed in Patent Document 1 includes a substrate, a sensor section (a fixed portion and a movable portion) provided on the substrate, and a cover bonded to the substrate so as to seal the sensor section. Further, in a portion exposed from the cover of the substrate, a terminal electrically connected to the sensor section is provided, so that an external device and the sensor section can be electrically connected to each other through the terminal.

In such an acceleration sensor disclosed in Patent Document 1, although the configuration of the terminal is not clear, it is generally configured to include a foundation layer formed on the substrate and a coating layer formed on the foundation layer. Then, for example, the foundation layer is composed of a material in consideration of adhesion to the substrate and the coating layer, and the coating layer is composed of a material in consideration of reduction in electrical resistance, antioxidation, compatibility with a bonding wire, etc.

However, in the case where the terminal is constituted by a stacked body of a foundation layer and a coating layer, for example, by applying heat during the step of producing the acceleration sensor, atoms in the foundation layer are diffused into the coating layer, and moreover, the diffused atoms are deposited on the surface of the coating layer, and therefore, it has a problem that the bonding strength between the terminal and the bonding wire is decreased.

SUMMARY

An advantage of some aspects of the invention is to provide an electronic device, an electronic device apparatus, an electronic apparatus, and a moving object, each capable of reducing a decrease in bonding strength to a bonding target.

The invention can be implemented as the following application examples.

An electronic device according to an application example of the invention includes a base body, a functional element disposed on the base body, a wiring disposed on the base body and electrically connected to the functional element, and a terminal disposed on the base body and electrically connected to the wiring, wherein the terminal includes a non-overlapping region which does not overlap with the wiring.

According to this configuration, migration or diffusion of the material contained in the wiring into the non-overlapping region can be reduced.

Therefore, for example, by connecting a bonding target to the non-overlapping region, an electronic device capable of suppressing a decrease in bonding strength to the bonding target is formed.

In the electronic device according to the application example of the invention, it is preferred that the terminal includes an overlapping region which overlaps with the wiring.

According to this configuration, the wiring and the terminal can be more reliably electrically connected to each other.

In the electronic device according to the application example of the invention, it is preferred that the overlapping region is disposed so as to surround the non-overlapping region.

According to this configuration, the area of the overlapping region can be made larger, and therefore, the wiring and the terminal can be more reliably electrically connected to each other.

In the electronic device according to the application example of the invention, it is preferred that the electronic device includes an intermediate layer disposed between the wiring and the overlapping region.

According to this configuration, the intermediate layer serves as a barrier layer, and therefore, migration or diffusion of the material (atoms) contained in the wiring into the terminal can be reduced.

In the electronic device according to the application example of the invention, it is preferred that the intermediate layer is also disposed between the base body and the non-overlapping region.

According to this configuration, the intermediate layer serves as a foundation layer, and therefore, the bonding strength between the terminal and the base can be increased.

In the electronic device according to the application example of the invention, it is preferred that the constituent material of the wiring contains platinum.

According to this configuration, in the production of the electronic device, electric discharge between the wiring and the functional element is less likely to occur. Therefore, disconnection or deterioration of the wiring, or scattering or the like of the wiring material can be reduced.

In the electronic device according to the application example of the invention, it is preferred that the surface of the base body on which the wiring and the terminal are disposed contains an insulating oxide.

According to this configuration, the structure of the base becomes simple.

An electronic device apparatus according to an application example of the invention includes the electronic device according to the application example of the invention, an electronic component, and a bonding wire electrically connecting the terminal of the electronic device to the electronic component, wherein the bonding wire is connected to the non-overlapping region of the terminal.

According to this configuration, the effect of the electronic device according to the application example of the invention can be acquired, and an electronic device apparatus having high reliability is obtained.

In the electronic device apparatus according to the application example of the invention, it is preferred that the non-overlapping region and the bonding wire contain the same material.

According to this configuration, the bonding strength between the terminal and the bonding wire can be increased.

An electronic apparatus according to an application example of the invention includes the electronic device according to the application example of the invention.

According to this configuration, the effect of the electronic device according to the application example of the invention can be acquired, and an electronic apparatus having high reliability is obtained.

A moving object according to an application example of the invention includes the electronic device according to the application example of the invention.

According to this configuration, the effect of the electronic device according to the application example of the invention can be acquired, and a moving object having high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electronic device, an electronic device apparatus, an electronic apparatus, and a moving object according to the invention will be described in detail with reference to embodiments shown in the accompanying drawings.

First Embodiment

First, an electronic device according to a first embodiment of the invention will be described.

Figure 1:
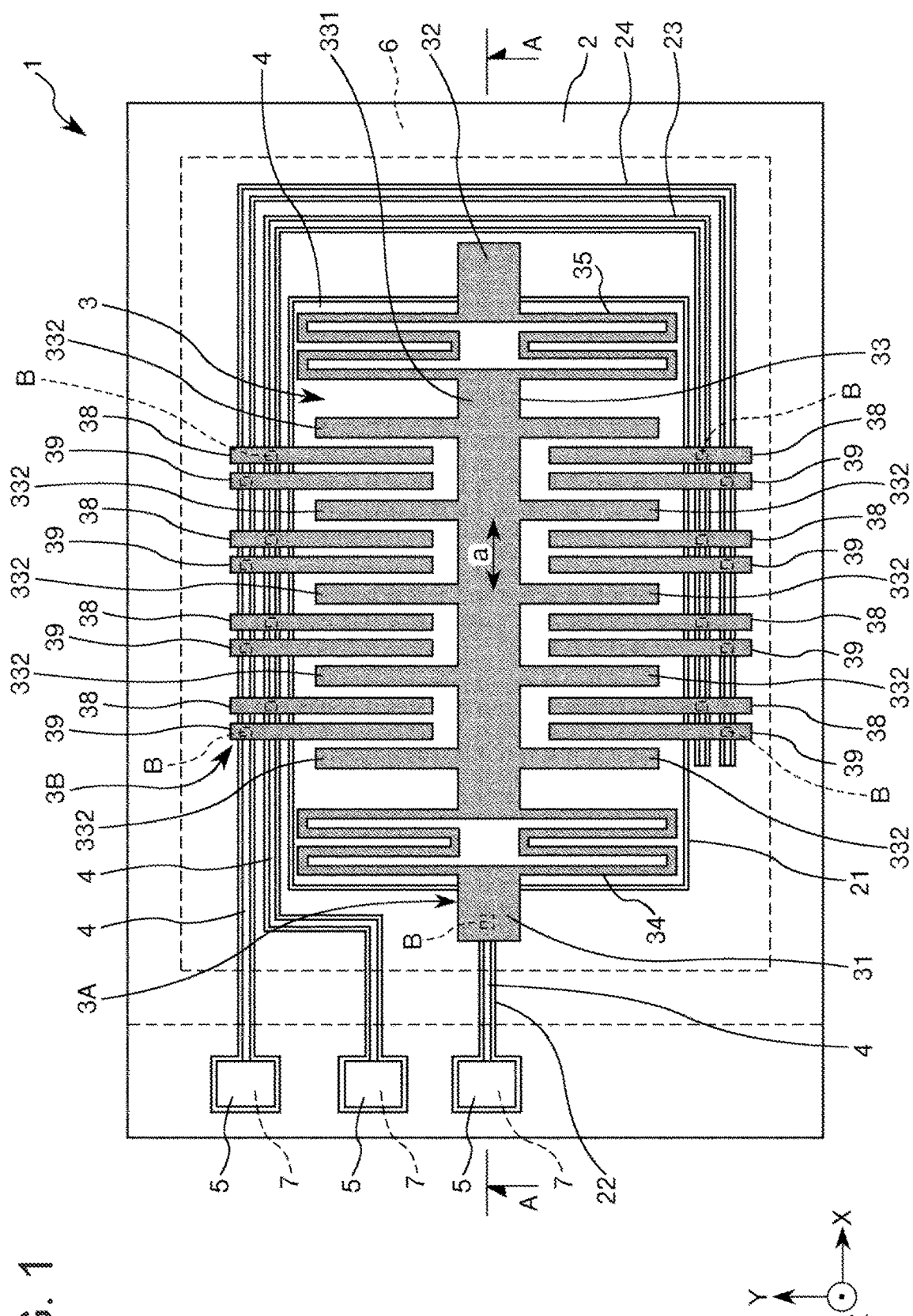
FIG. 1 is a plan view showing an electronic device according to a first embodiment of the invention.
Figure 2:
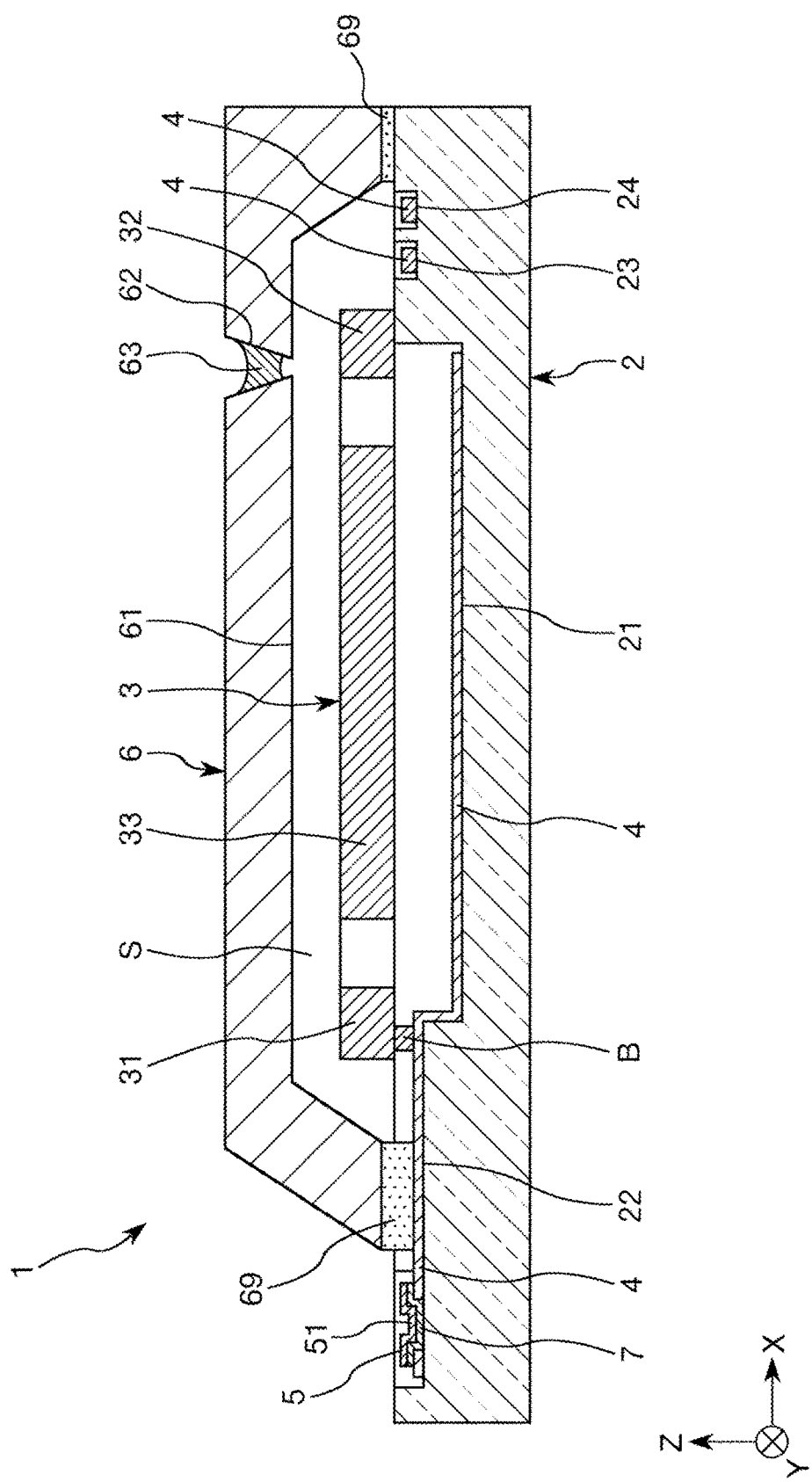
FIG. 2 is a cross-sectional view taken along the line A-A in FIG. 1.
Figure 3:
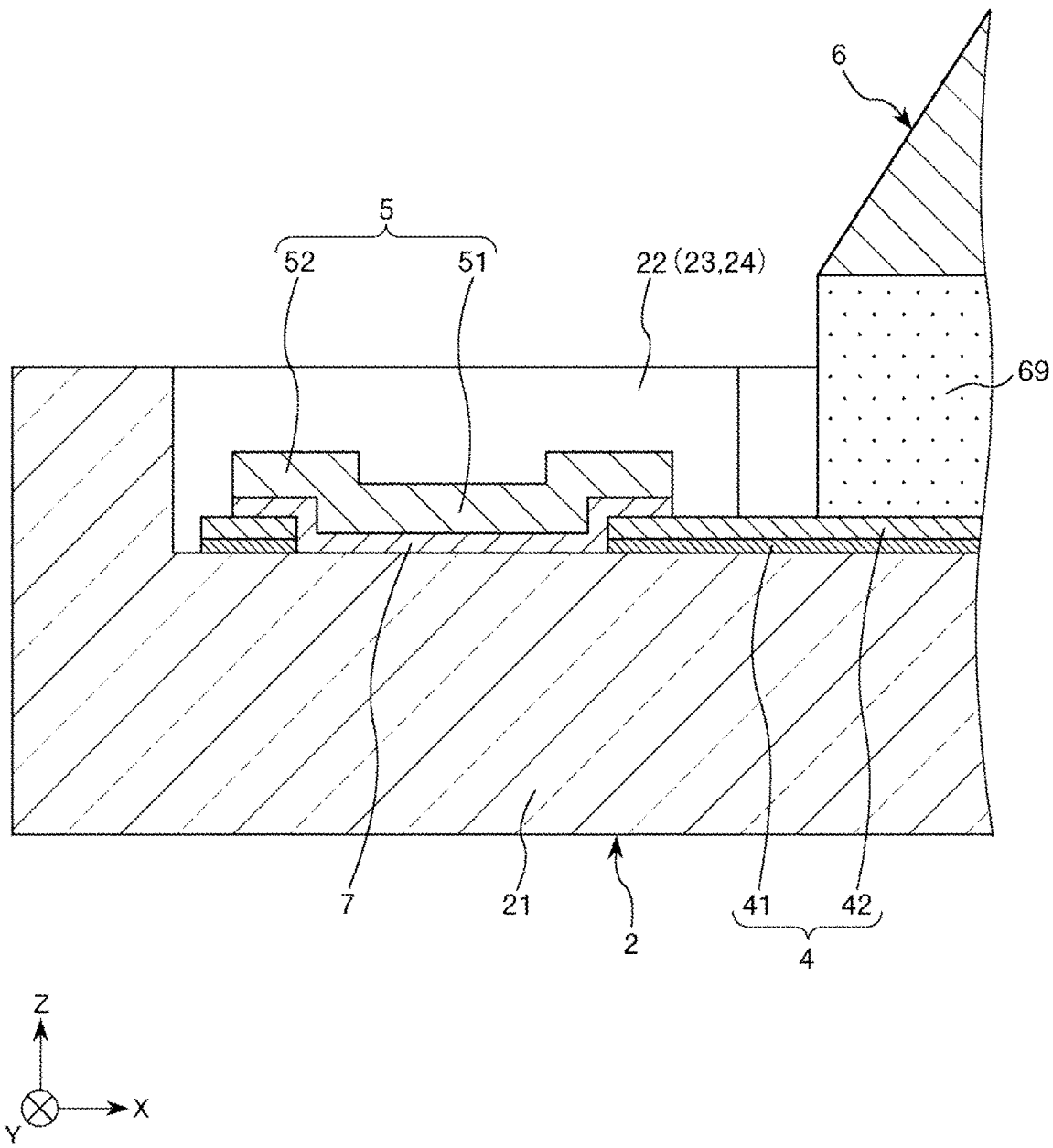
FIG. 3 is a cross-sectional view of a terminal included in the electronic device shown in FIG. 1.
Figure 4:
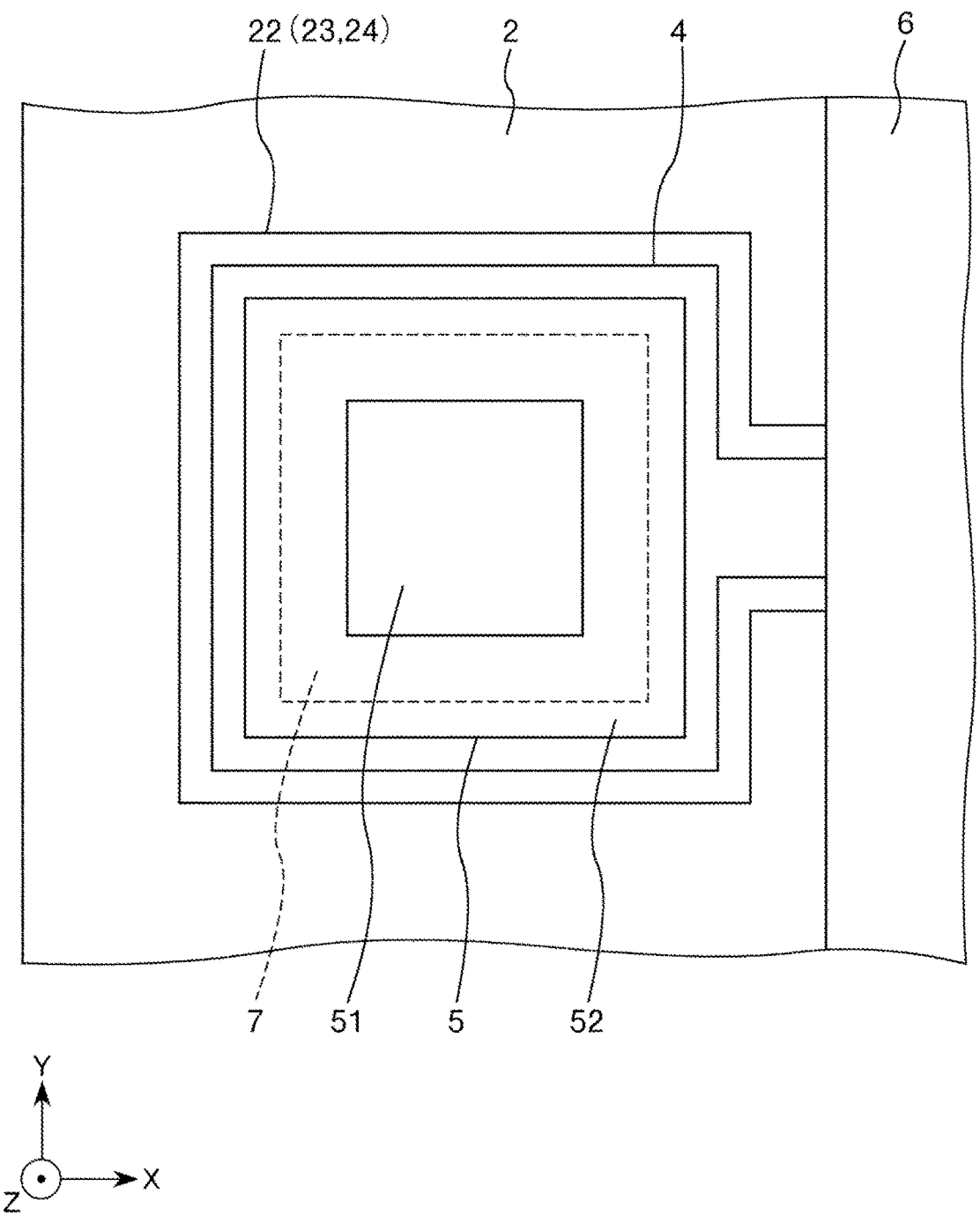
FIG. 4 is a plan view of the terminal included in the electronic device shown in FIG. 1.
Figure 5:
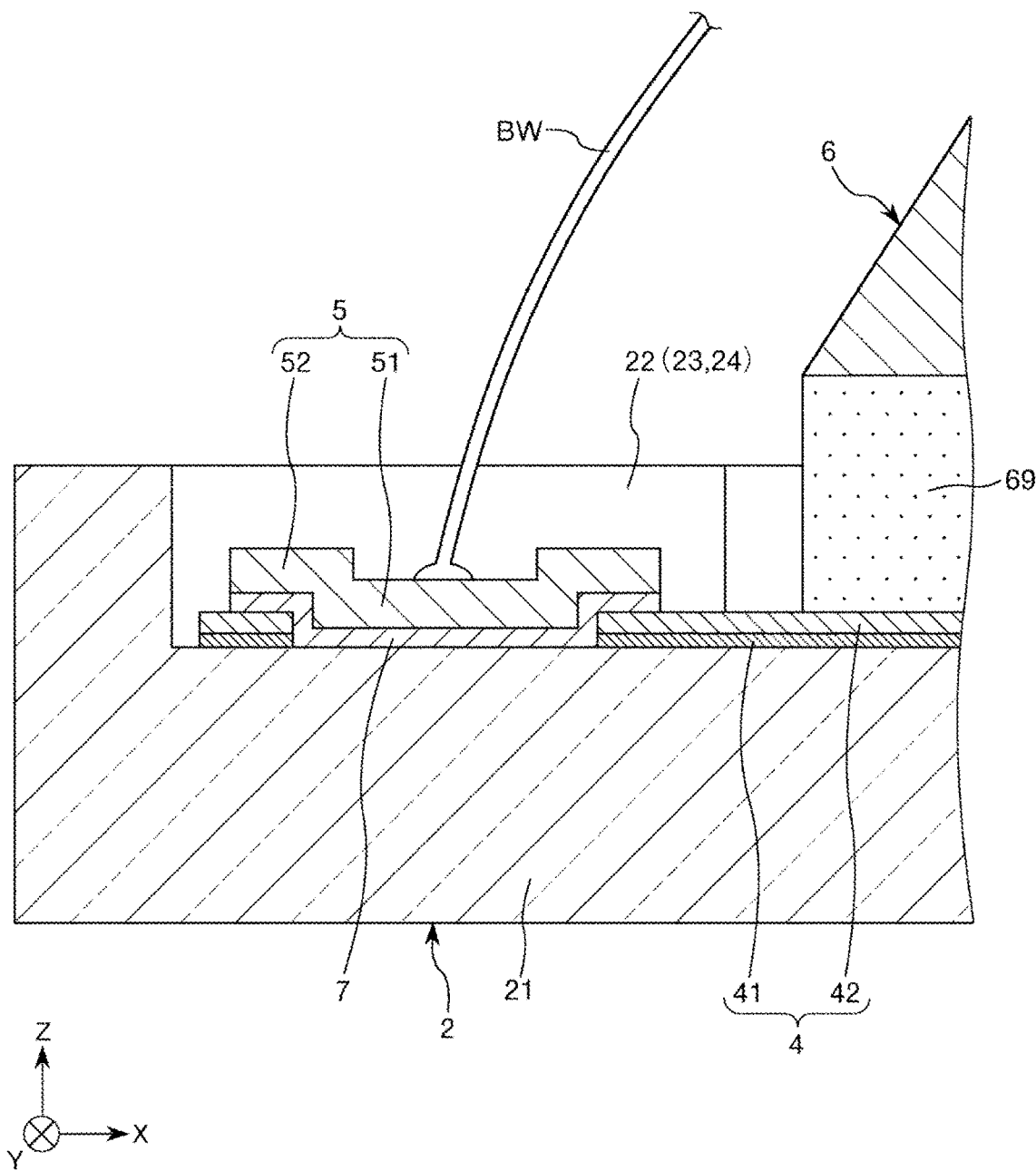
FIG. 5 is a cross-sectional view in a state where a bonding wire is connected to the terminal shown FIG. 3.
Figure 6:
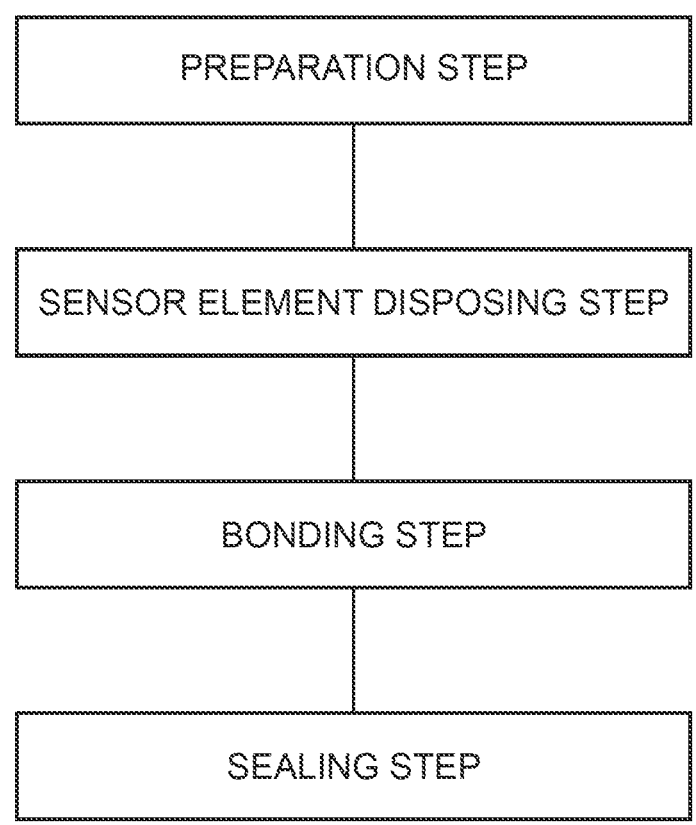
FIG. 6 is a flowchart showing a method for producing the electronic device shown in FIG. 1.

FIG. 1 is a plan view showing an electronic device according to a first embodiment of the invention. FIG. 2 is across-sectional view taken along the line A-A in FIG. 1. FIG. 3 is a cross-sectional view of a terminal included in the electronic device shown in FIG. 1. FIG. 4 is a plan view of the terminal included in the electronic device shown in FIG. 1. FIG. 5 is a cross-sectional view in a state where a bonding wire is connected to the terminal shown FIG. 3. FIG. 6 is a flowchart showing a method for producing the electronic device shown in FIG. 1. FIGS. 7 to 11 are cross-sectional views illustrating the method for producing the electronic device shown in FIG. 1. In the following description, for the sake of convenience of explanation, the upper side and the lower side in FIG. 2 are also referred to as "upper" and "lower", respectively. Further, in the respective drawings, as three axes orthogonal to each other, X axis, Y axis, and Z axis are shown. Further, in the following description, the direction parallel to the X axis, the direction parallel to the Y axis, and the direction parallel to the Z axis are also referred to as "X axis direction", "Y axis direction", and "Z axis direction", respectively. Further, a plan view viewed from the Z axis direction (the thickness direction of the electronic device) is also simply referred to as "plan view".

As shown in FIG. 1, an electronic device 1 includes abase body 2, an acceleration sensor element 3 as a functional element disposed on the base body 2, a wiring 4 disposed on the base body 2 and electrically connected to the acceleration sensor element 3, and a terminal 5 disposed on the base body 2 and electrically connected to the wiring 4. As shown in FIG. 3, the terminal 5 includes a non-overlapping region 51 which does not overlap with the wiring 4 in plan view. According to the electronic device 1 having such a configuration, the non-overlapping region 51 does not overlap with the wiring 4, and therefore, migration or diffusion of the material (wiring material) contained in the wiring 4 into the non-overlapping region 51 can be suppressed. Therefore, deposition of the wiring material on the surface of the non-overlapping region 51 can be suppressed, and as shown in FIG. 5, by connecting a connection wiring such as a bonding wire BW to the non-overlapping region 51, the bonding wire BW can be connected to the terminal 5 with a high bonding strength. That is, according to such a configuration, the electronic device 1 capable of suppressing a decrease in the bonding strength to the bonding wire BW is obtained. The member to be connected to the non-overlapping region 51 is not limited to the bonding wire BW. Hereinafter, such an electronic device 1 will be described in detail.

As shown in FIG. 1, the electronic device 1 includes the base body 2, the acceleration sensor element 3 (functional element) disposed on the base body 2, the wiring 4 disposed on the base body 2 and electrically connected to the acceleration sensor element 3, and the terminal 5 disposed on the base body 2 and electrically connected to the wiring 4, and as shown in FIG. 2, further includes a lid body 6 bonded to the base body 2 so as to house the acceleration sensor element 3 between the lid body 6 and the base body 2, and an intermediate layer 7 disposed between the wiring 4 and the terminal 5.

The base body 2 is in the form of a plate with a rectangular plan view shape and has a concave portion 21 which opens on the upper surface. This concave portion 21 functions as a relief portion for preventing contact between the acceleration sensor element 3 and the base body 2. Further, the base body 2 includes groove portions 22, 23, and 24, each of which opens on the upper surface and is disposed around the concave portion 21. On the groove portions 22, 23, and 24, the wiring 4 electrically connected to the acceleration sensor element 3, the intermediate layer 7, and the terminal 5 are disposed. Each terminal 5 is exposed on the outside of the lid body 6, and through these terminals 5, an external device and the acceleration sensor element 3 can be electrically connected to each other.

Further, on the surface of the base body 2 on which the wiring 4 and the terminal 5 are disposed, that is, the bottom surface of the concave portion 21 preferably contains an insulating oxide. According to this, while simplifying the configuration of the base body 2, a short circuit between a plurality of wirings 4 (between the terminals 5) can be suppressed. The base body 2 of this embodiment is, for example, a glass substrate constituted by a glass material (for example, a borosilicate glass such as pyrex glass (registered trademark)) containing alkali metal ions (mobile ions). Therefore, the base body 2 has a light transmission property (internal visibility). However, the base body 2 is not limited to the glass substrate, and for example, a silicon substrate or a ceramic substrate may be used. In the case where a silicon substrate is used, a silicon substrate having a high resistance is used, or a silicon substrate having a silicon oxide film (an insulating oxide) formed on the surface by thermal oxidation or the like is preferably used.

As shown in FIG. 1, the wiring 4 is provided in each of the groove portions 22, 23, and 24. Each wiring 4 is electrically connected to the acceleration sensor element 3. Further, as shown in FIG. 2, the wiring 4 provided in the groove portion 22 is disposed also on the bottom surface of the concave portion 21 and spreads thereon. According to this, as also described in the below-mentioned method for producing the electronic device 1, the electrical potentials of the base body 2 and the acceleration sensor element 3 (silicon substrate 30) can be made equal to each other, and therefore, sticking in the production can be suppressed.

The constituent material of such a wiring 4 contains platinum (Pt). Specifically, as shown in FIG. 3, the wiring 4 includes a foundation layer 41 disposed on the base body 2 and an electrode layer 42 disposed on the foundation layer 41, and the electrode layer 42 is constituted by platinum (Pt) or an alloy (platinum-based alloy) containing platinum (Pt). According to this, the electrode layer 42 has a small electrical resistance, and further has excellent corrosion resistance (oxidation resistance) so that the increase in electrical resistance due to corrosion (oxidation) is suppressed. Further, as also described in the below-mentioned method for producing the electronic device 1, electric discharge between the wiring 4 and the acceleration sensor element 3 is less likely to occur in the process for producing the electronic device 1, and therefore, damage to the wiring 4, deterioration thereof, or scattering of the wiring material therearound can be suppressed. As a result, disconnection or a short circuit can be effectively suppressed.

The thickness of the electrode layer 42 is not particularly limited, but is preferably, for example, about 50 nm or more and 100 nm or less, more preferably about 60 nm. According to this, the wiring 4 has a smaller electrical resistance while preventing an excessive increase in the thickness of the wiring 4.

The constituent material of the electrode layer 42 is not limited to platinum (Pt), and examples thereof include noble metals other than platinum, that is, gold (Au), silver (Ag), palladium (Pd), rhodium (Rh), iridium (Ir), ruthenium (Ru), and osmium (Os), and alloys containing any of these noble metals, and among these, it is also possible to use one type or two or more types in combination (for example, as a stacked body of two or more layers). By using such a material, in the same manner as platinum, the electrode layer 42 having excellent corrosion resistance is obtained, and also the electrical resistance of the wiring 4 can be made smaller. In addition, as the constituent material of the electrode layer 42, other than the above-mentioned noble metals and alloys containing any of these noble metals, a material having a relatively small electrical resistance, for example, a metal material such as copper (Cu), aluminum (Al), or nickel (Ni), an alloy containing any of these metals, or the like can also be used.

On the other hand, the foundation layer 41 is constituted by titanium (Ti) or an alloy (titanium-based alloy) containing titanium (Ti). According to this, the adhesion between the base body 2 and the wiring 4 can be enhanced. The thickness of such a foundation layer 41 is not particularly limited, but is preferably, for example, about 100 nm or more and 150 nm or less, more preferably about 130 nm. According to this, the above-mentioned effect can be effectively exhibited while preventing an excessive increase in the thickness of the wiring 4. The constituent material of the foundation layer 41 is not limited to titanium (Ti) as long as the same effect can be exhibited, and varies also depending on the material of the base body 2 or the electrode layer 42, however, examples thereof include metal materials such as tungsten (W), molybdenum (Mo), chromium (Cr), and nickel (Ni), and alloys containing any of these metals, and among these, it is also possible to use one type or two or more types in combination (for example, as a stacked body of two or more layers).

Hereinabove, the wiring 4 has been described, however, the configuration of the wiring 4 is not particularly limited, and for example, another layer may be interposed between the foundation layer 41 and the electrode layer 42. Further, the foundation layer 41 may be omitted.

As shown in FIG. 1, the terminal 5 is provided in each of the groove portions 22, 23, and 24. Each terminal 5 is electrically connected to the wiring 4 in each of the groove portions 22, 23, and 24. As shown in FIGS. 3 and 4, such a terminal 5 includes the non-overlapping region 51 which does not overlap with the wiring 4 in plan view and an overlapping region 52 which overlaps with the wiring 4 in plan view. According to such a configuration, migration or diffusion of the wiring material (such as Pt) contained in the wiring 4 into the non-overlapping region 51 is suppressed, and deposition of the wiring material on the surface of the non-overlapping region 51 can be suppressed. Therefore, as shown in FIG. 5, by connecting the terminal 5 to the bonding wire BW in the non-overlapping region 51, these members can be connected to each other with a high bonding strength. Further, by including the overlapping region 52 in the terminal 5, a wide contact area between the terminal 5 and the wiring 4 can be ensured, and therefore, the terminal 5 and the wiring 4 can be more reliably electrically connected to each other.

Further, as shown in FIG. 4, the overlapping region 52 is disposed so as to surround the circumference of the non-overlapping region 51 in plan view. According to this, a wider contact area between the terminal 5 and the wiring 4 can be ensured, and therefore, the terminal 5 and the wiring 4 can be more reliably electrically connected to each other. In particular, in this embodiment, the overlapping region 52 has a frame shape surrounding the entire circumference of the non-overlapping region 51. According to this, a wider contact area between the terminal 5 and the wiring 4 can be ensured, and therefore, the above-mentioned effect becomes more prominent. In addition, by forming the overlapping region 52 in a frame shape, the non-overlapping region 51 can be located in a central portion of the terminal 5. Therefore, by connecting the bonding wire BW to the central portion of the terminal 5, the bonding wire BW can be easily and reliably connected to the non-overlapping region 51. However, the shape of the overlapping region 52 is not particularly limited.

In this embodiment, the non-overlapping region 51 has a rectangular plan view shape, however, the plan view shape of the non-overlapping region 51 is not particularly limited, and may be, for example, a triangle, a five or more sided polygon, a circle, an ellipse, an irregular shape, or the like. Further, the size of the non-overlapping region 51 is preferably a size sufficient for connecting the bonding wire BW thereto and is not too large.

The constituent material of the terminal 5 is not particularly limited as long as the material has electrical conductivity, but is preferably a material having a relatively small electrical resistance. Examples of such a material include various metal materials such as gold (Au), copper (Cu), and aluminum (Al), and alloys containing any of these metal materials, and among these, it is possible to use one type or two or more types in combination (for example, as a stacked body of two or more layers). In this embodiment, the terminal 5 is constituted by gold (Au) or a gold (Au)-based alloy. According to this, the terminal 5 which has particularly excellent corrosion resistance (oxidation resistance) and a small electrical resistance is obtained. The thickness of such a terminal 5 is not particularly limited, but is preferably, for example, about 200 nm or more and 400 nm or less, more preferably about 300 nm. According to this, the bonding wire BW and the terminal 5 can be more reliably connected to each other while preventing an excessive increase in the thickness of the terminal 5. The constituent material of the terminal 5 is preferably a material different from the constituent material of the wiring 4, and is particularly preferably a material which does not contain platinum (Pt).

Hereinabove, the terminal 5 has been described. In this embodiment, the non-overlapping region 51 and the overlapping region 52 are continuously and integrally formed, however, the non-overlapping region 51 and the overlapping region 52 may be formed as separate bodies.

As shown in FIG. 3, the intermediate layer 7 is provided between the overlapping region 52 of the terminal 5 and the wiring 4. That is, the electronic device 1 includes the intermediate layer 7 disposed between the wiring 4 and the overlapping region 52. The intermediate layer 7 functions as a barrier layer which suppresses migration or diffusion of the wiring material contained in the wiring 4 into the terminal 5. Therefore, migration or diffusion of the wiring material into the terminal 5 can be more effectively suppressed. Further, the intermediate layer 7 is also disposed between the base body 2 and the non-overlapping region 51. The intermediate layer 7 also functions as a foundation layer which enhances the adhesion between the base body 2 and the terminal 5. Due to this, for example, as compared with the case where the intermediate layer 7 is not provided between the base body 2 and the non-overlapping region 51, the bonding strength between the base body 2 and the terminal 5 can be increased, and the reliability of the electronic device 1 is further improved. As a method for measuring the bonding strength between the terminal 5 and the base body 2, a cross-cut test (JIS K 5600-5-6) can be used.

The constituent material of the intermediate layer 7 is not particularly limited as long as the material can exhibit the above-mentioned function (that is, the function as the barrier layer and the foundation layer), and examples thereof include metal materials such as titanium (Ti), tungsten (W), tantalum (Ta), nickel (Ni), cobalt (Co), chromium (Cr), and molybdenum (Mo), and alloys or compounds containing any of these metal materials (for example, TiN, TiW, TaN, TaW, etc.), and among these, it is possible to use one type or two or more types in combination (for example, as a stacked body of two or more layers). In this embodiment, the intermediate layer 7 is constituted by TiW. By using such a material, the intermediate layer 7 is easily produced and has excellent effect described above. The thickness of such an intermediate layer 7 is not particularly limited, but is preferably, for example, about 50 nm or more and 150 nm or less, more preferably about 100 nm. According to this, the above-mentioned function (that is, the function as the barrier layer and the foundation layer) can be more effectively exhibited while preventing an excessive increase in the thickness of the intermediate layer 7.

In this embodiment, the intermediate layer 7 is disposed between the terminal 5 and each of the base body 2 and the wiring 4 so as to overlap with the entire region of the terminal 5, however, a portion overlapping with the non-overlapping region 51 may be omitted. That is, the intermediate layer 7 may have a frame shape located between the wiring 4 and the overlapping region 52. On the contrary, a portion overlapping with the overlapping region 52 may be omitted. Further, the intermediate layer 7 itself may be omitted.

As shown in FIGS. 1 and 2, the lid body 6 is in the form of a plate with a rectangular plan view shape and has a concave portion 61 which opens on the lower surface. The lid body 6 is bonded to the base body 2 so as to house the acceleration sensor element 3 inside the concave portion 61. By the lid body 6 and the base body 2, a housing space S for housing the acceleration sensor element 3 is formed. Further, the lid body 6 has a communication hole 62 for communicating the inside and the outside of the housing space S, and through this communication hole 62, the atmosphere in the housing space S can be replaced with a desired atmosphere. In the communication hole 62, a sealing member 63 is disposed, and by the sealing member 63, the communication hole 62 is sealed. The sealing member 63 is not particularly limited as long as it can seal the communication hole 62, and for example, any of various alloys such as a gold (Au)/tin (Sn)-based alloy, a gold (Au)/germanium (Ge)-based alloy, and a gold (Au)/aluminum (Al)-based alloy, a glass material such as a low-melting point glass, or the like can be used.

Such a lid body 6 is constituted by a silicon substrate in this embodiment. However, the lid body 6 is not limited to the silicon substrate, and for example, a glass substrate or a ceramic substrate may be used. A method of bonding the base body 2 to the lid body 6 is not particularly limited, and may be appropriately selected according to the material of the base body 2 or the lid body 6, however, examples thereof include anodic bonding, surface activated bonding for bonding surfaces to be bonded activated by plasma irradiation, bonding through a bonding material such as a glass frit, and diffusion bonding for bonding metal films formed on the upper surface of the base body 2 and the lower surface of the lid body 6.

In this embodiment, the base body 2 and the lid body 6 are bonded through a glass frit 69 (a low-melting point glass) which is an example of the bonding material. In a state where the base body 2 and the lid body 6 are overlapped with each other, the inside and the outside of the housing space S communicate with each other through the groove portions 22, 23, and 24, however, by disposing the glass frit 69 for bonding therebetween, the groove portions 22, 23, and 24 can be filled with the glass frit 69. In this manner, by using the glass frit 69, bonding between the base body 2 and the lid body 6 and sealing of the groove portions 22, 23, and 24 can be performed simultaneously. In the case where the base body 2 and the lid body 6 are bonded by anodic bonding or the like (a bonding method with which the groove portions 22, 23, and 24 cannot be sealed), the groove portions 22, 23, and 24 can be sealed with, for example, a $SiO_2$ film formed by a CVD method or the like using TEOS (tetraethoxysilane).

As shown in FIG. 1, the acceleration sensor element 3 is bonded to the upper surface of the base body 2 so as to overlap with the concave portion 21. Further, the acceleration sensor element 3 includes a movable body 3A having a portion which is displaceable with respect to the base body 2 and a fixed body 3B whose position is fixed with respect to the base body 2. Such an acceleration sensor element 3 can be formed by, for example, patterning the silicon substrate doped with an impurity such as phosphorus (P) or boron (B). Further, the acceleration sensor element 3 is bonded to the upper surface of the base body 2 by anodic bonding. However, the material of the acceleration sensor element 3 and the method of bonding the acceleration sensor element 3 to the base body 2 are not particularly limited.

The movable body 3A includes support portions 31 and 32, a movable portion 33, and connection portions 34 and 35. The support portions 31 and 32 are disposed so as to sandwich the concave portion 21 therebetween, and both are bonded to the upper surface of the base body 2. Further, the support portion 31 is electrically connected to the wiring 4 through a conductive bump B.

The movable portion 33 is located between the support portions 31 and 32. The movable portion 33 is connected to the support portion 31 through the connection portion 34 on the −X axis side, and connected to the support portion 32 through the connection portion 35 on the +X axis side. Such a movable portion 33 can be displaced in the X axis direction as shown by the arrow a with respect to the support portions 31 and 32 while elastically deforming the connection portions 34 and 35. Further, the movable portion 33 includes a base portion 331 extending in the X axis direction and a plurality of movable electrode fingers 332 protruding on both sides in the Y axis direction from the base portion 331 and arranged in a comb shape.

The fixed body 3B includes a plurality of first fixed electrode fingers 38 and a plurality of second fixed electrode fingers 39. The plurality of first fixed electrode fingers 38 are disposed on one side in the X axis direction of the movable electrode fingers 332 and arranged so as to be engaged with the corresponding movable electrode fingers 332 with a space therebetween. On the other hand, the plurality of second fixed electrode fingers 39 are disposed on the other side in the X axis direction of the movable electrode fingers 332 and arranged so as to be engaged with the corresponding movable electrode fingers 332 with a space therebetween. Further, each of the first fixed electrode fingers 38 is electrically connected to the wiring 4 through a conductive bump B, and each of the second fixed electrode fingers 39 is electrically connected to the wiring 4 through a conductive bump B.

Hereinabove, the electronic device 1 has been described. Next, an operation of the electronic device 1 will be described. When acceleration in the X axis direction is applied to the electronic device 1, based on the magnitude of the acceleration, the movable portion 33 is displaced in the X axis direction while elastically deforming the connection portions 34 and 35. Accompanying such displacement, a gap between the movable electrode finger 332 and the first fixed electrode finger 38 and a gap between the movable electrode finger 332 and the second fixed electrode finger 39 are changed respectively, and accompanying this displacement, the magnitude of the electrostatic capacity between the movable electrode finger 332 and the first fixed electrode finger 38 and the magnitude of the electrostatic capacity between the movable electrode finger 332 and the second fixed electrode finger 39 are changed respectively. Therefore, the acceleration can be detected based on such a change in electrostatic capacity (differential signal).

Here, it is preferred that in the housing space S, an inert gas such as nitrogen, helium, or argon is enclosed, and the pressure in the housing space S is substantially atmospheric pressure at a working temperature (about −40° C. to 80° C.). By setting the pressure in the housing space S to atmospheric pressure, the viscous resistance is increased to exhibit a damping effect, so that the vibration of the movable portion 33 can be rapidly converged (damped). Therefore, the accuracy of detection of acceleration of the electronic device 1 is improved.

Next, a method for producing the electronic device 1 will be described. As shown in FIG. 6, the method for producing the electronic device 1 includes a preparation step of preparing the base body 2, a sensor element disposing step of disposing the acceleration sensor element 3 on the base body 2, a bonding step of bonding the lid body 6 to the base body 2, and a sealing step of sealing the lid body 6.

Preparation Step

Figure 7:
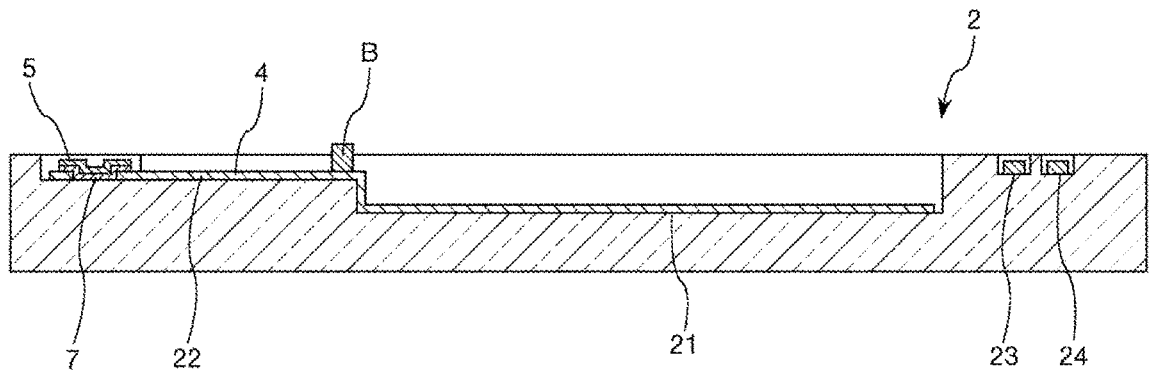
FIG. 7 is a cross-sectional view illustrating the method for producing the electronic device shown in FIG. 1.

First, as shown in FIG. 7, the base body 2 composed of a glass substrate is prepared, and the concave portion 21 and the groove portions 22, 23, and 24 are formed by etching. Subsequently, on the base body 2, the wiring 4, the intermediate layer 7, the terminal 5, and the conductive bump B are formed sequentially.

Sensor Element Disposing Step

Figure 8:
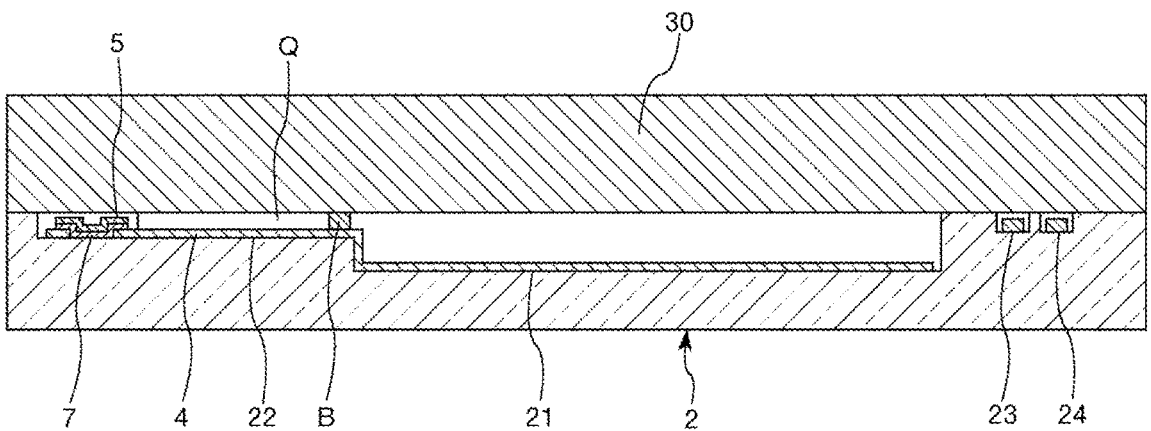
FIG. 8 is a cross-sectional view illustrating the method for producing the electronic device shown in FIG. 1.
Figure 9:
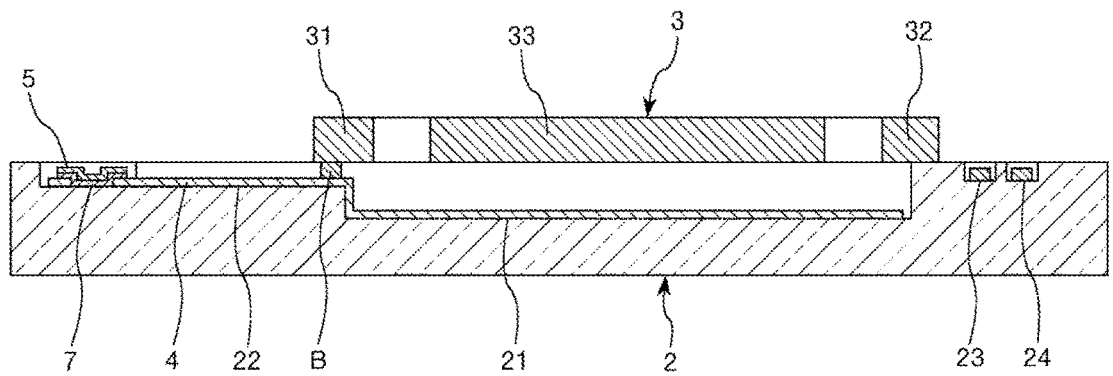
FIG. 9 is a cross-sectional view illustrating the method for producing the electronic device shown in FIG. 1.

Subsequently, as shown in FIG. 8, the silicon substrate 30 which is a base material of the acceleration sensor element 3 is anodically bonded to the upper surface of the base body 2. Subsequently, the silicon substrate 30 is thinned using CMP (chemical mechanical polishing) as needed, and thereafter, an impurity such as phosphorus (P) or boron (B) is doped (or diffused) into the silicon substrate 30 so as to make the silicon substrate 30 electrically conductive. Subsequently, the silicon substrate 30 is patterned by etching (preferably, dry etching such as RIE (reactive ion etching)), whereby the acceleration sensor element 3 is formed as shown in FIG. 9.

In general, when performing anodic bonding, a high voltage is applied between the base body 2 and the silicon substrate 30, and therefore, there is a fear that an electrostatic force is generated between these members, and so-called "sticking" may occur such that the silicon substrate 30 is stuck to the base body 2. On the other hand, in this embodiment, as described above, the wiring 4 is provided also on the bottom surface of the concave portion 21, and this wiring 4 is electrically conducted with the silicon substrate 30 through the conductive bump B, and therefore has the same electrical potential as the silicon substrate 30. Due to this, the above-mentioned electrostatic force is not generated between the base body 2 and the silicon substrate 30, and thus, the above-mentioned sticking can be effectively suppressed. Further, as described above, the electrode layer 42 of the wiring 4 is composed of platinum (Pt), and therefore, electric discharge in a portion where the wiring 4 and the silicon substrate 30 face each other through a gap (for example, a region represented by Q in FIG. 8) can be suppressed. As a result, damage to the wiring 4, deterioration thereof, or scattering of the wiring material can be suppressed, and disconnection or a short circuit can be suppressed.

Further, when performing anodic bonding, the wiring 4 is exposed to a high temperature (for example, about 400° C.), and therefore, there is a fear that the material (wiring material) contained in the wiring 4 may migrate or diffuse into the terminal 5. On the other hand, as described above, the intermediate layer 7 which is a barrier layer is provided between the wiring 4 and the terminal 5, and therefore, migration or diffusion of the wiring material into the terminal 5 can be suppressed. Further, even if the wiring material passes through the intermediate layer 7 and migrates or diffuses into the terminal 5, most of the material is retained in the overlapping region 52, and migration or diffusion of the material into the non-overlapping region 51 is suppressed.

Bonding Step

Figure 10:
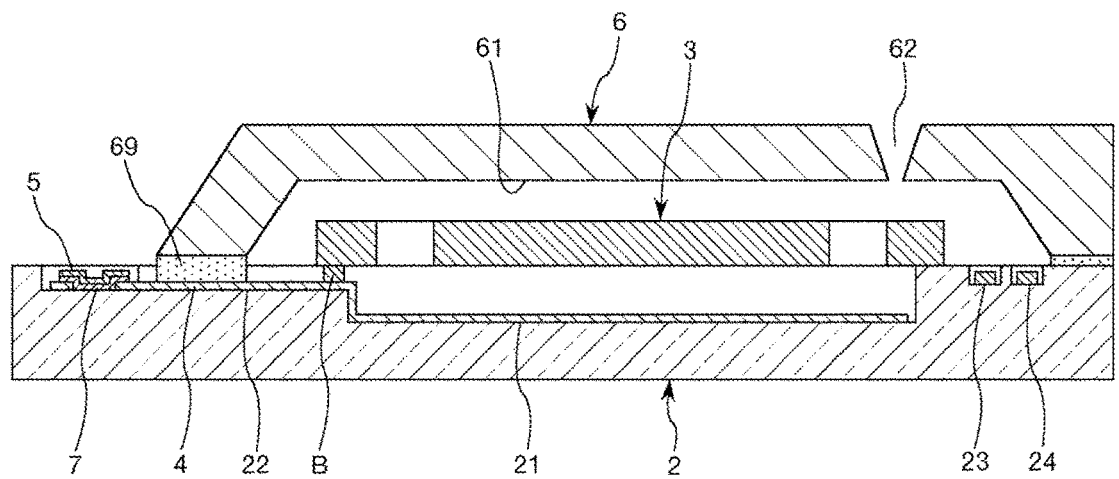
FIG. 10 is a cross-sectional view illustrating the method for producing the electronic device shown in FIG. 1.

Subsequently, the lid body 6 having the concave portion 61 and the communication hole 62 formed therein is prepared, and as shown in FIG. 10, the lid body 6 is bonded to the base body 2 through the glass frit 69. Here, when performing this bonding, in order to melt the glass frit 69, the wiring 4 is exposed to a high temperature (for example, about 300° C.), and therefore, there is a fear that the material (wiring material) contained in the wiring 4 may migrate or diffuse into the terminal 5. On the other hand, as described above, the intermediate layer 7 which is a barrier layer is provided between the wiring 4 and the terminal 5, and therefore, migration or diffusion of the wiring material into the terminal 5 can be suppressed. Further, even if the wiring material passes through the intermediate layer 7 and migrates or diffuses into the terminal 5, most of the material is retained in the overlapping region 52, and migration or diffusion of the material into the non-overlapping region 51 is suppressed.

Sealing Step

Figure 11:
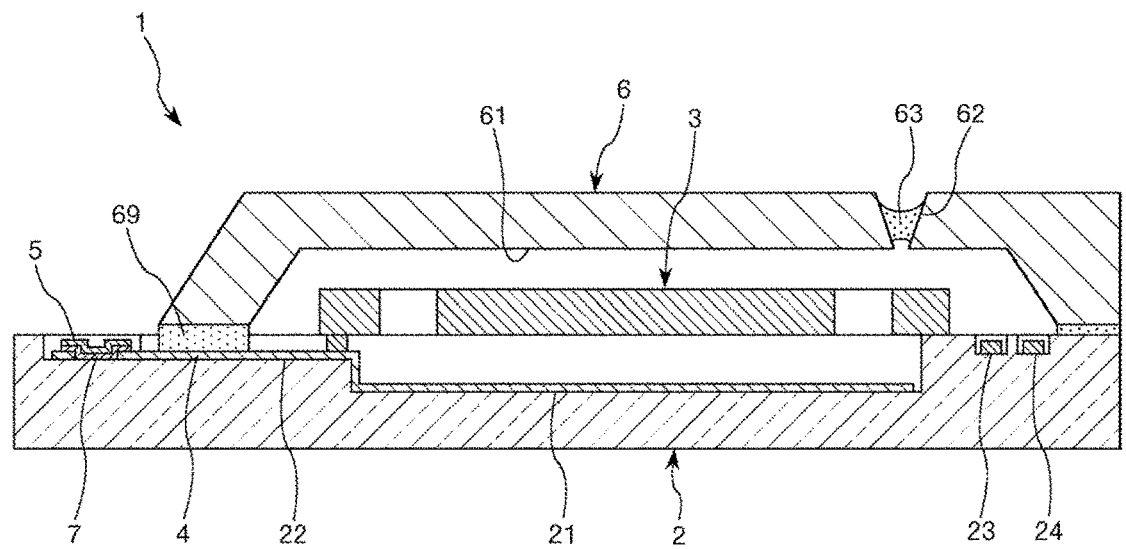
FIG. 11 is a cross-sectional view illustrating the method for producing the electronic device shown in FIG. 1.

Subsequently, as shown in FIG. 11, the communication hole 62 of the lid body 6 is sealed with the sealing member 63. This sealing can be performed by, for example, disposing the sealing member 63 in a ball shape in the communication hole 62, and irradiating the sealing member 63 with a laser light beam, thereby melting and curing the sealing member 63. By the above-mentioned steps, the electronic device 1 is obtained.

Second Embodiment

Next, an electronic device according to a second embodiment of the invention will be described.

Figure 12:
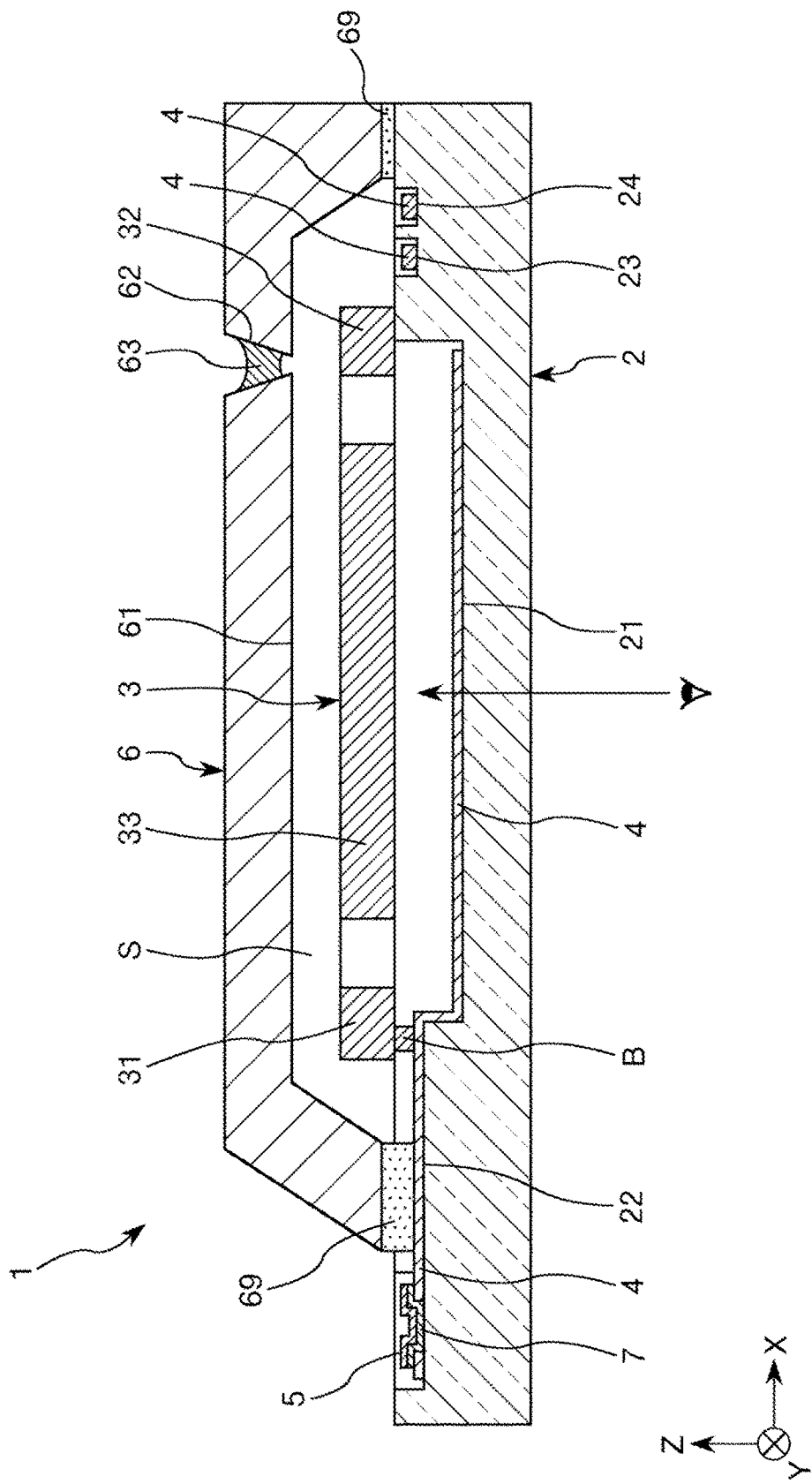
FIG. 12 is a cross-sectional view showing an electronic device according to a second embodiment of the invention.

FIG. 12 is a cross-sectional view showing an electronic device according to a second embodiment of the invention.

The electronic device according to this embodiment is the same as the electronic device according to the above-mentioned first embodiment except that the configuration of the wiring is mainly different.

In the following description, with respect to the electronic device of the second embodiment, different points from the above-mentioned embodiment will be mainly described, and the description of the same matter will be omitted. Further, in FIG. 12, components similar to those described previously are denoted by the same reference numerals.

In the electronic device 1 shown in FIG. 12, the wiring 4 has a light transmission property. As described above, the base body 2 has a light transmission property (internal visibility), and therefore, the inside of the housing space S can be visually confirmed from the bottom surface side of the base body 2 without being obstructed by the wiring 4. Therefore, for example, the state of the acceleration sensor element 3 (particularly, whether or not sticking occurs), the state of electrical connection between the wiring 4 and the acceleration sensor element 3, or the like can be confirmed. The constituent material of such a wiring 4 is not particularly limited as long as it has a light transmission property and electrical conductivity, and examples thereof include oxide-based transparent electrically conductive materials such as ITO (indium tin oxide), IZO (indium zinc oxide), ZnO, and IGZO, and among these, it is possible to use one type or two or more types in combination. In particular, in this embodiment, the wiring 4 is constituted by ITO. According to this, in the same manner as in the above-mentioned first embodiment, electric discharge between the wiring 4 and the acceleration sensor element 3 is less likely to occur in the process for producing the electronic device 1, and therefore, damage to the wiring 4, deterioration thereof, or scattering of the wiring material therearound can be suppressed. As a result, disconnection of the wiring 4 or a short circuit can be effectively suppressed.

Also according to such a second embodiment, the same effects as those of the above-mentioned first embodiment can be exhibited.

Third Embodiment

Next, an electronic device apparatus according to a third embodiment of the invention will be described.

Figure 13:
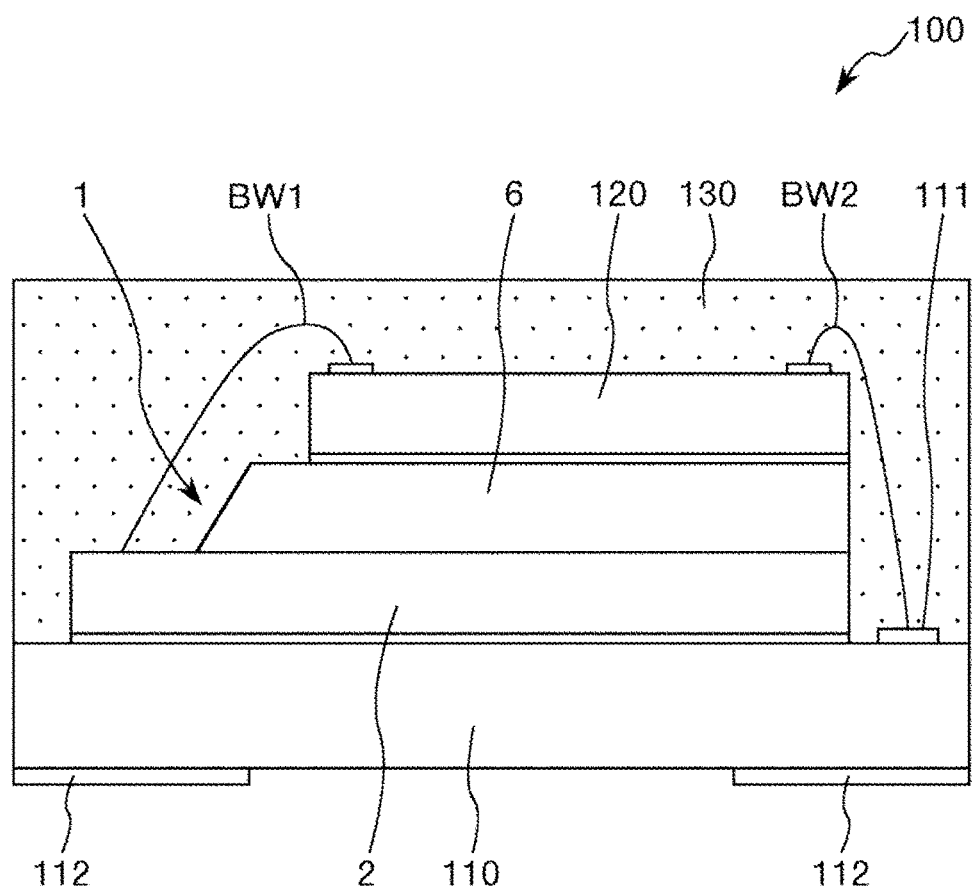
FIG. 13 is a cross-sectional view showing an electronic device apparatus according to a third embodiment of the invention.
Figure 14:
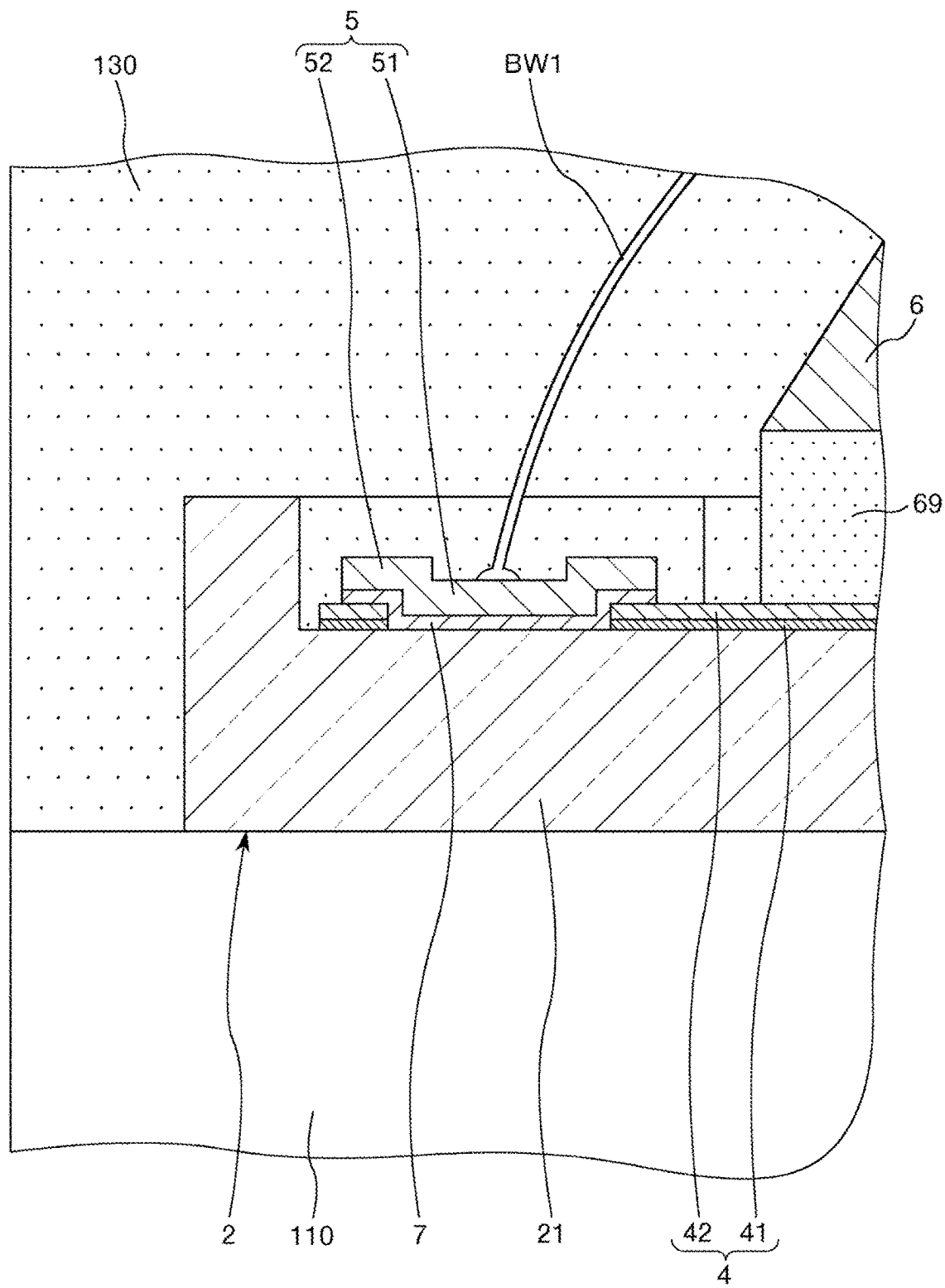
FIG. 14 is a partially enlarged view of the electronic device apparatus shown in FIG. 13.

FIG. 13 is a cross-sectional view showing an electronic device apparatus according to a third embodiment of the invention. FIG. 14 is a partially enlarged view of the electronic device apparatus shown in FIG. 13.

As shown in FIG. 13, an electronic device apparatus 100 includes the electronic device 1, a circuit element 120 (IC) as an electronic component, and a bonding wire BW1 electrically connecting the terminal 5 of the electronic device 1 to the circuit element 120. Further, as shown in FIG. 14, the bonding wire BW1 is connected to the non-overlapping region 51 of the terminal 5. According to such a configuration, as described in the above-mentioned first embodiment, the bonding strength between the terminal 5 and the bonding wire BW1 can be increased, and therefore, the electronic device apparatus 100 has high reliability. Hereinafter, such an electronic device apparatus 100 will be described in detail.

As shown in FIG. 13, the electronic device apparatus 100 includes a base substrate 110, the electronic device 1 provided on the base substrate 110, the circuit element 120 provided on the electronic device 1, the bonding wire BW1 electrically connecting the electronic device 1 to the circuit element 120, a bonding wire BW2 electrically connecting the base substrate 110 to the circuit element 120, and a mold section 130 which molds the electronic device 1 and the circuit element 120.

The base substrate 110 is a substrate which supports the electronic device 1, and is, for example, an interposer substrate. On the upper surface of such a base substrate 110, a plurality of connecting terminals 111 are disposed, and on the lower surface thereof, a plurality of mounting terminals 112 are disposed. Further, in the base substrate 110, an internal wiring (not shown) is disposed, and through this internal wiring, each of the connecting terminals 111 is electrically connected to the corresponding mounting terminal 112. The base substrate 110 is not particularly limited, and for example, a silicon substrate, a ceramic substrate, a resin substrate, a glass substrate, a glass epoxy substrate, or the like can be used.

The electronic device 1 is disposed on the base substrate 110 such that the base body 2 faces downward (on the base substrate 110 side). Then, the electronic device 1 is bonded to the base substrate 110 through a bonding member.

The circuit element 120 is disposed on the electronic device 1. Then, the circuit element 120 is bonded to the electronic device 1 through the bonding member. Further, the circuit element 120 is electrically connected to the terminal 5 of the electronic device 1 through the bonding wire BW1, and is electrically connected to the connecting terminal 111 of the base substrate 110 through the bonding wire BW2. In such a circuit element 120, a driving circuit which drives the electronic device 1, a detection circuit which detects acceleration based on an output signal from the electronic device 1, an output circuit which converts a signal from the detection circuit into a predetermined signal and outputs the signal, or the like is included as needed.

Here, it is preferred that the non-overlapping region 51 and the bonding wire BW1 contain the same material. According to this, the affinity between the non-overlapping region 51 and the bonding wire BW1 is enhanced, and therefore, the bonding strength between these members can be increased. Therefore, the electronic device apparatus 100 having higher reliability is obtained. The constituent material of the non-overlapping region 51 is not particularly limited, however, in this embodiment, gold (Au) or a gold (Au)-based alloy is used. Here, as the bonding wire BW1, a gold wire (a high-purity gold wire), a copper wire (a high-purity copper wire), an aluminum wire (a high-purity aluminum wire and an aluminum alloy wire) are generally known, and these are used according to the intended purpose or the like. Therefore, the non-overlapping region 51 preferably contains gold (Au) of this embodiment, or either material of copper (Cu) and aluminum (Al) other than gold (constituted by any of the materials). According to this, a general bonding wire BW1 described above can be used, and the production cost or the like can be reduced. Further, in the case where the constituent material of the wiring 4 contains platinum (Pt), the constituent materials of the non-overlapping region 51 and the bonding wire BW1 are preferably materials which do not substantially contain platinum (Pt).

The mold section 130 molds the electronic device 1 and the circuit element 120. According to this, the electronic device 1 and the circuit element 120 can be protected from moisture, dust, impact, etc. The mold section 130 is not particularly limited, however, for example, a thermosetting epoxy resin can be used, and can be molded by, for example, a transfer molding method.

The electronic device apparatus 100 as described above includes the above-mentioned electronic device 1. Therefore, the effect of the electronic device 1 can be acquired, and the electronic device apparatus 100 having high reliability is obtained.

Electronic Apparatus

Next, an electronic apparatus according to the invention will be described.

Figure 15:
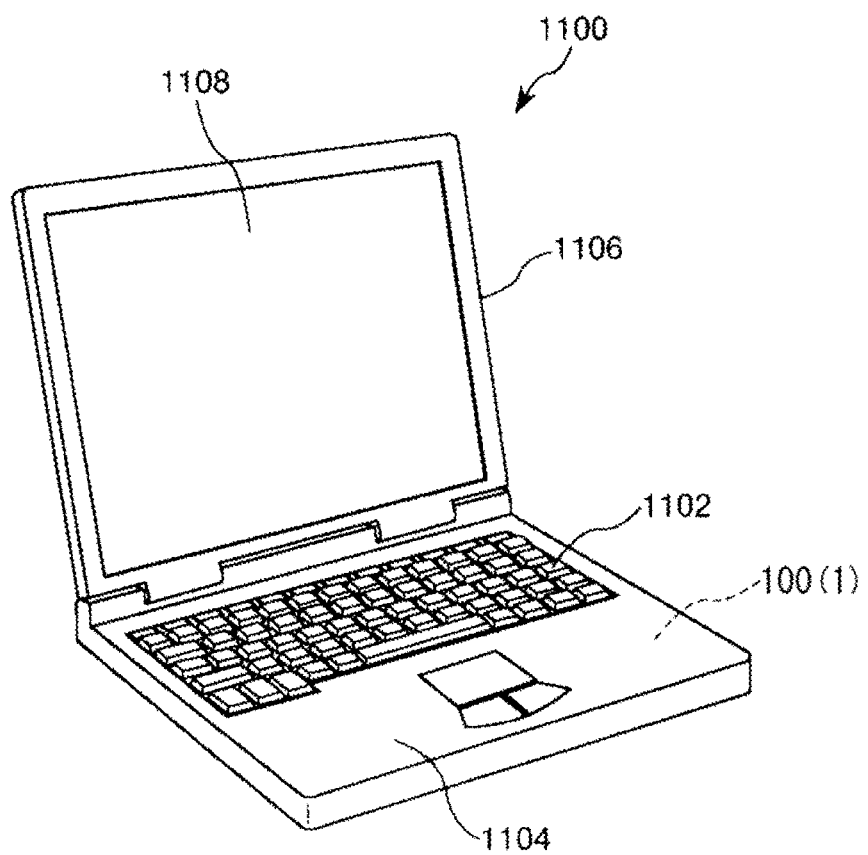
FIG. 15 is a perspective view showing a configuration of a mobile (or notebook) personal computer, to which an electronic apparatus according to the invention is applied.

FIG. 15 is a perspective view showing a configuration of a mobile (or notebook) personal computer, to which an electronic apparatus according to the invention is applied. In this drawing, a personal computer 1100 is configured to include a main body 1104 provided with a keyboard 1102 and a display unit 1106 provided with a display section 1108, and the display unit 1106 is supported rotatably with respect to the main body 1104 through a hinge structure. Such a personal computer 1100 includes the electronic device apparatus 100 (electronic device 1) as an acceleration sensor.

Figure 16:
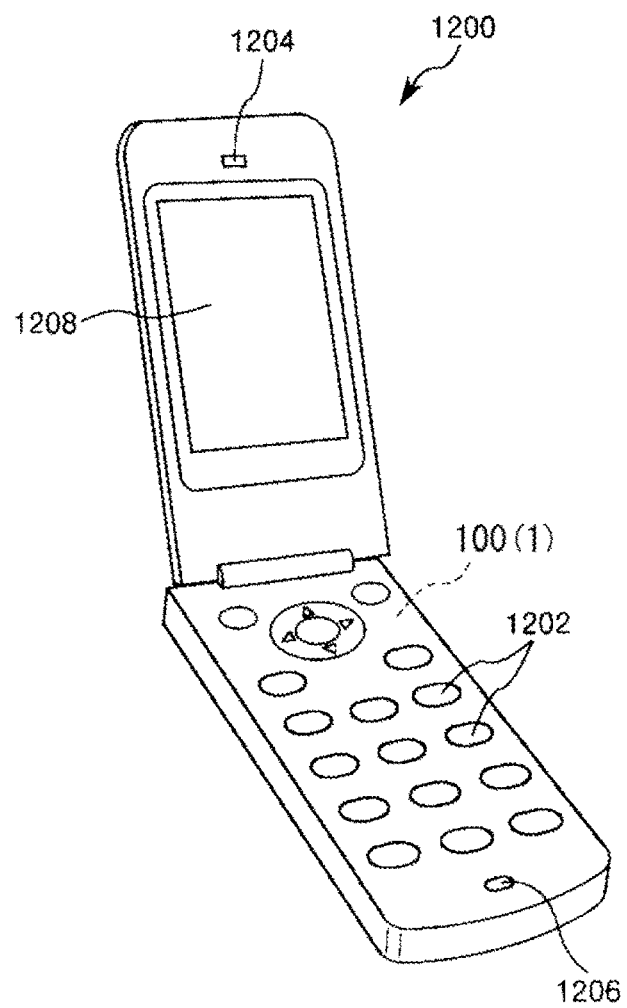
FIG. 16 is a perspective view showing a configuration of a mobile phone (also including a smartphone, a PHS, etc.) to which an electronic apparatus according to the invention is applied.

FIG. 16 is a perspective view showing a configuration of a mobile phone (also including a smartphone, a PHS, etc.) to which an electronic apparatus according to the invention is applied. In this drawing, a mobile phone 1200 includes an antenna (not shown), a plurality of operation buttons 1202, an earpiece 1204, and a mouthpiece 1206, and a display section 1208 is disposed between the operation buttons 1202 and the earpiece 1204. Such a mobile phone 1200 includes the electronic device apparatus 100 (electronic device 1) as an acceleration sensor.

Figure 17:
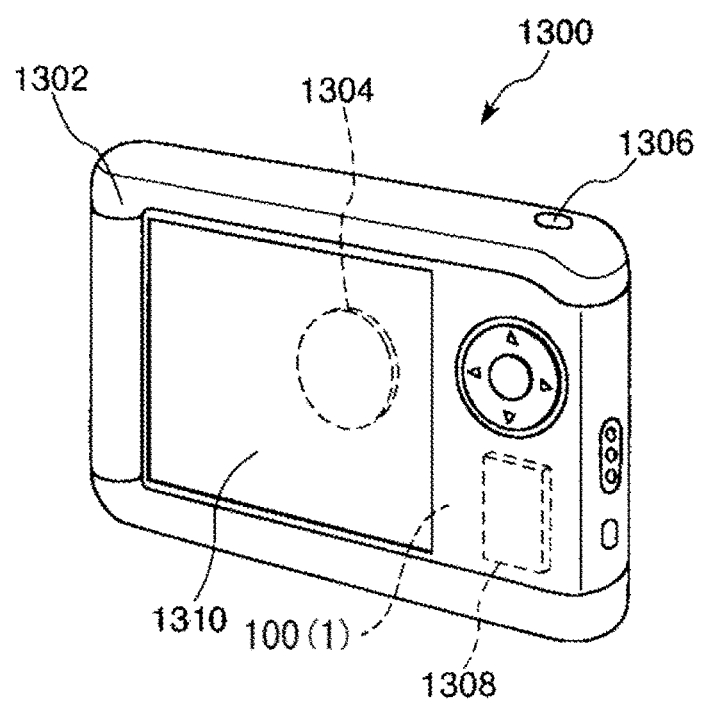
FIG. 17 is a perspective view showing a configuration of a digital still camera to which an electronic apparatus according to the invention is applied.

FIG. 17 is a perspective view showing a configuration of a digital still camera to which an electronic apparatus according to the invention is applied. In this drawing, a display section 1310 is provided on the back surface of a case 1302 in the digital still camera 1300 and is configured to perform display based on an imaging signal from a CCD. The display section 1310 functions as a viewfinder that displays a subject as an electronic image. In addition, a light receiving unit 1304 including an optical lens (imaging optical system), a CCD, and the like is provided on the front side (back side in the drawing) of the case 1302. When a person who takes a picture confirms a subject image displayed on the display section 1310 and presses a shutter button 1306, the imaging signal from the CCD at that time point is transferred to a memory 1308 and stored therein. Such a digital still camera 1300 includes the electronic device apparatus 100 (electronic device 1) as an acceleration sensor.

The personal computer 1100, the mobile phone 1200, and the digital still camera 1300, each of which is an example of such an electronic apparatus, include the electronic device apparatus 100 (electronic device 1). Therefore, the effect of the electronic device apparatus 100 (electronic device 1) described above can be acquired, and thus, the electronic apparatus has high reliability.

The electronic apparatus according to the invention can be applied to, other than the personal computer shown in FIG. 15, the mobile phone shown in FIG. 16, and the digital still camera shown in FIG. 17, for example, smartphones, tablet terminals, timepieces (including smartwatches), inkjet type ejection devices (such as inkjet printers), laptop personal computers, televisions, wearable terminals such as HMD (head mounted displays), video cameras, videotape recorders, car navigation devices, pagers, electronic notebooks (including those having a communication function), electronic dictionaries, electronic calculators, electronic game devices, word processors, work stations, television telephones, television monitors for crime prevention, electronic binoculars, POS terminals, medical devices (such as electronic thermometers, blood pressure meters, blood sugar meters, electrocardiographic monitoring devices, ultrasound diagnostic devices, and electronic endoscopes), fish finders, various measurement devices, gauges (such as gauges for vehicles, airplanes, and ships), flight simulators, and the like.

Moving Object

Next, a moving object according to the invention will be described.

Figure 18:
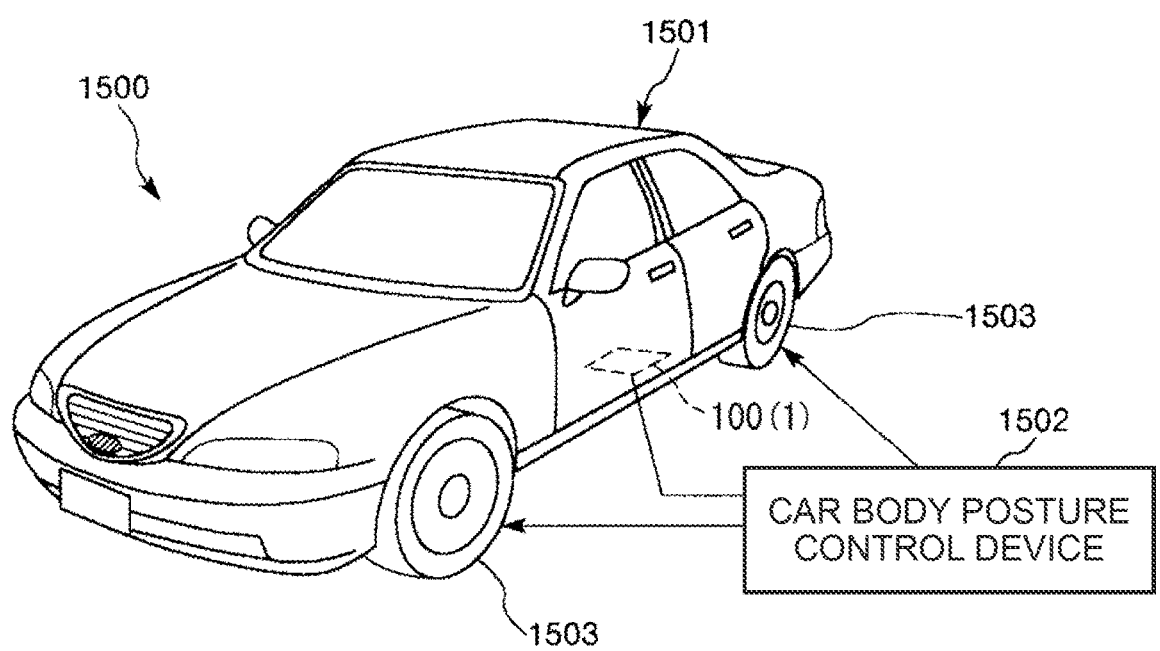
FIG. 18 is a perspective view showing a car to which a moving object according to the invention is applied.

FIG. 18 is a perspective view showing a car to which a moving object according to the invention is applied. In this drawing, a car 1500 includes the electronic device apparatus 100 (electronic device 1), and with the use of the electronic device apparatus 100, the posture of a car body 1501 can be detected. A detection signal from the electronic device apparatus 100 is supplied to a car body posture control device 1502, and the car body posture control device 1502 detects the posture of the car body 1501 based on the signal, and can control the hardness of the suspension or the brake of each wheel 1503 according to the detection result.

The car 1500 which is an example of such a moving object includes the above-mentioned electronic device apparatus 100 (electronic device 1). Therefore, the effect of the electronic device apparatus 100 (electronic device 1) described above can be acquired, and thus, the moving object has high reliability.

The electronic device apparatus 100 (electronic device 1) can be widely applied to, for example, electronic control units (ECU) such as keyless entry systems, immobilizers, car navigation systems, car air conditioning systems, anti-lock brake systems (ABS), airbags, tire pressure monitoring systems (TPMS), engine control systems, and battery monitors for hybrid cars or electrical cars in addition thereto.

Hereinabove, the electronic device, the electronic device apparatus, the electronic apparatus, and the moving object according to the invention have been described with reference to the embodiments shown in the drawings, however, the invention is not limited thereto, and the configuration of each part can be replaced with an arbitrary configuration having the same function. Further, in the invention, another arbitrary structure may be added to the invention, and also the above-mentioned embodiments may be appropriately combined with each other.

In the above-mentioned embodiments, the configuration in which the acceleration sensor element is used as the functional element has been described, however, the functional element is not limited thereto, and may be, for example, any of various sensor elements such as an angular velocity sensor element, a pressure sensor element, and a magnetic sensor element, or may be a vibrator to be used in an oscillator. Further, the number of functional elements is not particularly limited, and may be one, or may be two or more. In the case where the number of functional elements is two or more, functional elements having the same configuration may be combined, or functional elements having different configurations may be combined. For example, two acceleration sensor elements may be combined, or an acceleration sensor element and an angular velocity sensor element may be combined.

The entire disclosure of Japanese Patent Application No. 2016-193937, filed Sep. 30, 2016 is expressly incorporated by reference herein.

What is claimed is:

1. An electronic device comprising:
   a base body having first and second surfaces facing away from each other;
   a functional element disposed on the first surface of the base body;
   an electrode layer disposed on the first surface of the base body, the electrode layer being electrically connected to the functional element, the electrode layer being partially overlapped with the functional element in a plan view; and
   a terminal disposed on the first surface of the base body, a first part of the terminal directly contacting the first surface of the base body in the plan view, a second part of the terminal directly contacting the electrode layer in the plan view, the terminal being electrically connected to the electrode layer such that the second part of the terminal indirectly contacts the first surface of the base body,
   wherein the second part of the terminal surrounds the first part of the terminal in the plan view.

2. The electronic device according to claim 1,
   wherein the terminal is configured with a main layer and an intermediate layer stacked on the main layer so that the intermediate layer is disposed between the electrode layer and the main layer in the second part of the terminal.

3. The electronic device according to claim 2,
   wherein the intermediate layer is also disposed between the first surface of the base body and the main layer in the first part of the terminal.

4. An electronic device apparatus comprising:
   the electronic device according to claim 3,
   a circuit element; and
   a bonding wire electrically connecting the terminal of the electronic device to the circuit element,
   wherein the bonding wire is connected to the first part of the terminal.

5. A moving object comprising:
   the electronic device according to claim 3; and
   a posture control device.

6. The electronic device according to claim 2,
   wherein the electrode layer is configured with:
   a foundation layer directly disposed on the first surface of the base body, and
   a conductive layer directly stacked on the foundation layer, the conductive layer being located farther away from the base body than the foundation layer, and
   the foundation layer is composed of Ti or an alloy containing Ti, and
   the conductive layer is composed of Pt, Au, Ag, Pd, Rh, Ir, Ru, Os, or an alloy containing any of Pt, Au, Ag, Pd, Rh, Ir, Ru, or Os.

7. The electronic device according to claim 6,
   wherein the terminal is composed of Au, Cu, Al, or an alloy containing any of Au, Cu, or Al.

8. The electronic device according to claim 7,
   wherein the intermediate layer is composed of Ti, W, Ta, Ni, Co, Cr, Mo, or an alloy containing any of Ti, W, Ta, Ni, Co, Cr, or Mo.

9. An electronic apparatus comprising: the electronic device according to claim 6;
   a display; and
   a housing that houses the electronic device and the display.

10. A moving object comprising:
    the electronic device according to claim 6; and
    a posture control device.

11. An electronic device apparatus comprising:
    the electronic device according to claim 2;
    a circuit element; and
    a bonding wire electrically connecting the terminal of the electronic device to the circuit element,
    wherein the bonding wire is connected to the first part of the terminal.

12. The electronic device apparatus according to claim 11, wherein the same material is any of Au, Cu, and Al.

13. A moving object comprising:
    the electronic device according to claim 2; and
    a posture control device.

14. The electronic device according to claim 1,
    wherein the first surface of the base body on which the electrode layer and the terminal are disposed contains an insulating oxide.

15. The electronic device according to claim 1, wherein the functional element is at least any of an acceleration sensor element, an angular velocity sensor element, a pressure sensor element, and a magnetic sensor element.

16. An electronic device apparatus comprising:
   the electronic device according to claim 1;
   a circuit element; and
   a bonding wire electrically connecting the terminal of the electronic device to the circuit element,
   wherein the bonding wire is connected to the first part of the terminal.

17. The electronic device apparatus according to claim 16, wherein the first part of the terminal and the bonding wire contain a same material.

18. A moving object comprising:
   the electronic device according to claim 1; and
   a posture control device.

* * * * *